(12) United States Patent
Julson et al.

(10) Patent No.: US 9,349,227 B2
(45) Date of Patent: May 24, 2016

(54) METHODS AND APPARATUS FOR DIAGNOSING OPEN FAULTS IN AN AUTOMOTIVE ELECTRICAL CIRCUIT

(71) Applicant: GM GLOBAL TECHNOLOGY OPERATIONS LLC, Detroit, MI (US)

(72) Inventors: Timothy D. Julson, Rochester Hills, MI (US); Mark N. Howell, Rochester Hills, MI (US); Shuo Huang, Warren, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 57 days.

(21) Appl. No.: 14/100,548

(22) Filed: Dec. 9, 2013

(65) Prior Publication Data

US 2015/0161829 A1 Jun. 11, 2015

(51) Int. Cl.
*G07C 5/08* (2006.01)
*G01R 31/02* (2006.01)
*G01R 31/08* (2006.01)
*G01R 31/00* (2006.01)

(52) U.S. Cl.
CPC .............. *G07C 5/0808* (2013.01); *G01R 31/02* (2013.01); *G01R 31/026* (2013.01); *G01R 31/08* (2013.01); *G01R 31/083* (2013.01); *G01R 31/007* (2013.01)

(58) Field of Classification Search
CPC ...... G01R 31/007; G01R 31/08; G01R 31/02; G07C 5/0808
See application file for complete search history.

(56) References Cited

U.S. PATENT DOCUMENTS

| 4,103,225 | A | 7/1978 | Stephens |
| 6,008,654 | A | 12/1999 | Chaskell |
| 7,359,330 | B2 * | 4/2008 | Lunt ....................... H04M 3/30 370/244 |
| 7,463,984 | B2 * | 12/2008 | Kollner ............... G01R 31/025 323/237 |
| 7,495,450 | B2 * | 2/2009 | Furse et al. ................... 324/519 |
| 9,209,633 | B2 * | 12/2015 | Bandai .................. H02J 7/0006 |
| 2013/0293188 | A1 | 11/2013 | Bandai |

FOREIGN PATENT DOCUMENTS

| DE | 102005028184 A1 | 12/2006 |
| GB | 2269717 A | 2/1994 |

OTHER PUBLICATIONS

Chung, Y. et al., "Capacitance and Inductance Sensor Circuits For Detecting The Lengths Of Open- and Short-Circuited Wires", IEEE Transactions on Instrumentation and Measurement, vol. 58, No. 8, Aug. 2009.
German Patent and Trade Mark Office, Office Action in German Patent Application No. 10 2014 117 927.7 mailed Jul. 15, 2015.

* cited by examiner

*Primary Examiner* — Todd Melton
(74) *Attorney, Agent, or Firm* — Ingrassia Fisher & Lorenz, P.C.

(57) ABSTRACT

A method for detecting and locating an open-wire fault within a vehicle subsystem, is provided. The method compares an output voltage of a low-pass filter circuit of the vehicle subsystem to a threshold voltage; detects that an open-wire fault exists in the vehicle subsystem when the output voltage is not less than the threshold voltage; determines a capacitance value of the low-pass filter circuit; and performs a lookup, using the capacitance value, to determine the location of the detected open wire fault.

19 Claims, 10 Drawing Sheets

METHODS AND APPARATUS FOR DIAGNOSING OPEN FAULTS IN AN AUTOMOTIVE ELECTRICAL CIRCUIT

TECHNICAL FIELD

Embodiments of the subject matter described herein relate generally to diagnosing faults in an electrical circuit, and more particularly, relate to locating open wire faults in an automotive electrical circuit.

BACKGROUND

Recently, there has been significant growth in the number and complexity of automobile electronic control units (ECUs) and associated circuits. A typical ECU is connected to a number of other ECUs, various sensors, and loads. Many of these connections involve dedicated wiring and wire connections, increasing the possibility of, and potential locations for, wiring problems onboard the vehicle.

Vehicle wiring and connector faults occur at irregular and unpredictable intervals. Using conventional methods, such faults are difficult to locate. Accordingly, it is desirable to provide a simple, low-cost method for locating wiring connector faults within a vehicle subsystem. Furthermore, other desirable features and characteristics will become apparent from the subsequent detailed description and the appended claims, taken in conjunction with the accompanying drawings and the foregoing technical field and background.

BRIEF SUMMARY

A method for detecting and locating an open-wire fault within a vehicle subsystem is provided. The method compares an output voltage of a low-pass filter circuit of the vehicle subsystem to a threshold voltage; detects that an open-wire fault exists in the vehicle subsystem when the output voltage is not less than the threshold voltage; determines a capacitance value of the low-pass filter circuit; and performs a lookup, using the capacitance value, to determine the location of the detected open wire fault.

A non-transitory, computer-readable medium comprising instructions which, when executed by a processor, perform a method for detecting and locating an open-wire fault within a vehicle subsystem, is provided. The method compares an output voltage from a low-pass filter circuit, within the vehicle subsystem, to a threshold; and detects that an open-wire fault exists in the vehicle subsystem when the output voltage is not less than the threshold; determines a time-constant based on the output voltage; and determines a distance from an input voltage source, for the open-wire fault, based on the estimated time-constant.

A diagnostic system for detecting and locating an open-wire fault within a vehicle subsystem is provided. The diagnostic system includes a low-pass filter circuit, comprising at least a plurality of wires, the plurality of wires configured to conduct electrical signals for the vehicle subsystem; a vehicle chassis, coupled to the low-pass filter circuit and configured to serve as a ground potential for the vehicle subsystem; a system memory comprising at least one lookup table, the at least one lookup table comprising a plurality of capacitance levels corresponding to a plurality of respective distances; a processor architecture, operatively associated with the system memory, wherein the processor architecture is configured to: compare an output voltage, from the low-pass filter circuit, to a threshold; and detect that an open-wire fault exists in the vehicle subsystem when the output voltage is not less than a threshold; determine a capacitance value of the low-pass filter circuit; and perform a lookup, using the capacitance value, to determine the distance to the open-wire fault from the input voltage source.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter presented herein relates to apparatus and methods used to detect and locate wiring faults in a vehicle subsystem. In certain embodiments, an output voltage of a low-pass filter circuit is compared to a threshold to determine whether a fault exists within a vehicle subsystem. Once a fault has been detected, a location for the fault is determined by obtaining a capacitance value for the wiring in the vehicle subsystem, and performing a lookup to determine a distance value associated with the capacitance value.

Figure 1:
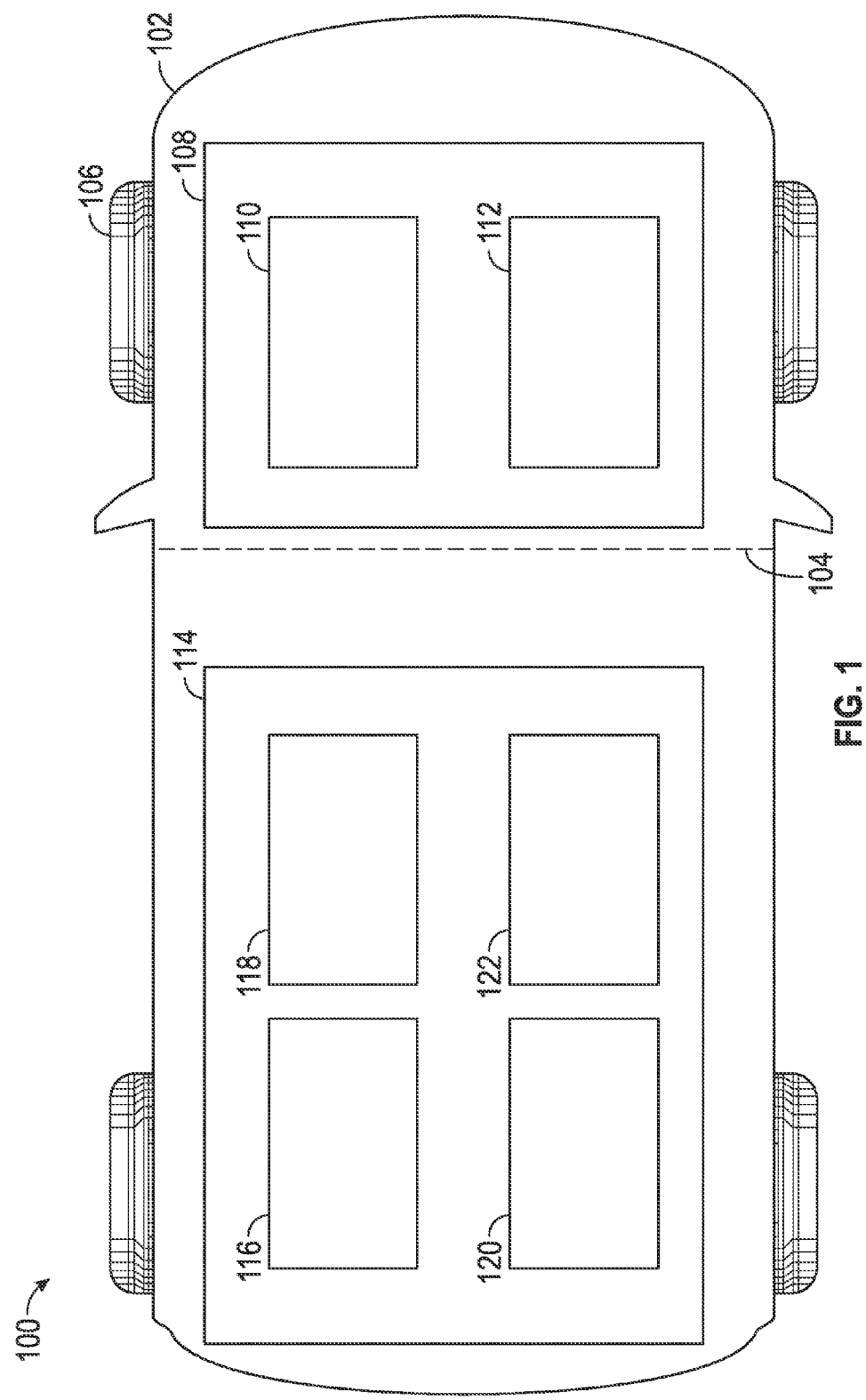
FIG. 1 is a functional block diagram of a vehicle that includes a fault detection and location module, in accordance with an exemplary embodiment.

Referring now to the figures, FIG. 1 is a functional block diagram of a vehicle 100 that includes a fault detection module 120 and a fault location module 122, in accordance with an exemplary embodiment. The vehicle 100 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The vehicle 100 includes a metal vehicle body 102 that is arranged on a chassis 104. The vehicle body 102 substantially encloses the other components of the vehicle 100. The vehicle body 102 is used as a ground plane, and thus is used as return to path to a vehicle battery (not shown). The vehicle body 102 and the chassis 104 are joined by a bridging ground strap to form a ground plane through the frame.

As depicted in FIG. 1, the vehicle 100 also includes a plurality of wheels 106, a drive system 108, and at least one vehicle subsystem 114. The wheels 106 are each rotationally coupled to the chassis 104 near a respective corner of the vehicle body 102 to facilitate movement of the vehicle 100. In a preferred embodiment, the vehicle 100 includes four wheels, although this may vary in other embodiments (for example for trucks and certain other automotive vehicles).

The drive system 108 is mounted on the chassis 104, and drives the wheels 106. The drive system 108 preferably comprises a propulsion system. In certain exemplary embodiments, the drive system 108 comprises a combustion engine 110 and/or an electric motor/generator, coupled with a transmission 112 thereof. In certain embodiments, the drive system 108 may vary, and/or two or more drive systems 108 may be used. By way of example, the vehicle 100 may also incorporate any one of, or combination of, a number of different types of electrical propulsion systems such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, or an electric motor.

For purposes of this application, the vehicle subsystem 114 may refer to any embedded system that controls one or more of the electrical systems or subsystems in a motor vehicle. The vehicle subsystem 114 may be one of a plurality of commonly accepted vehicle subsystems 114, to include, without limitation: an airbag module, a body controller, a driver door module, a cruise control module, an instrument panel, a climate control module, a transmission controller, a power distribution module, an anti-lock braking system (ABS) module, and the like. The vehicle subsystem 114 may otherwise be referred to as an electronic control unit (ECU) and associated interconnected wiring, sensors, loads, etc. An electrical topology exists in the vehicle, including an architecture of ECUs and interconnected wiring within the particular vehicle. The electrical wiring of the vehicle is configured to connect and conduct electrical signals between vehicle subsystems (e.g., ECUs) and various sensors and loads.

Figure 2:
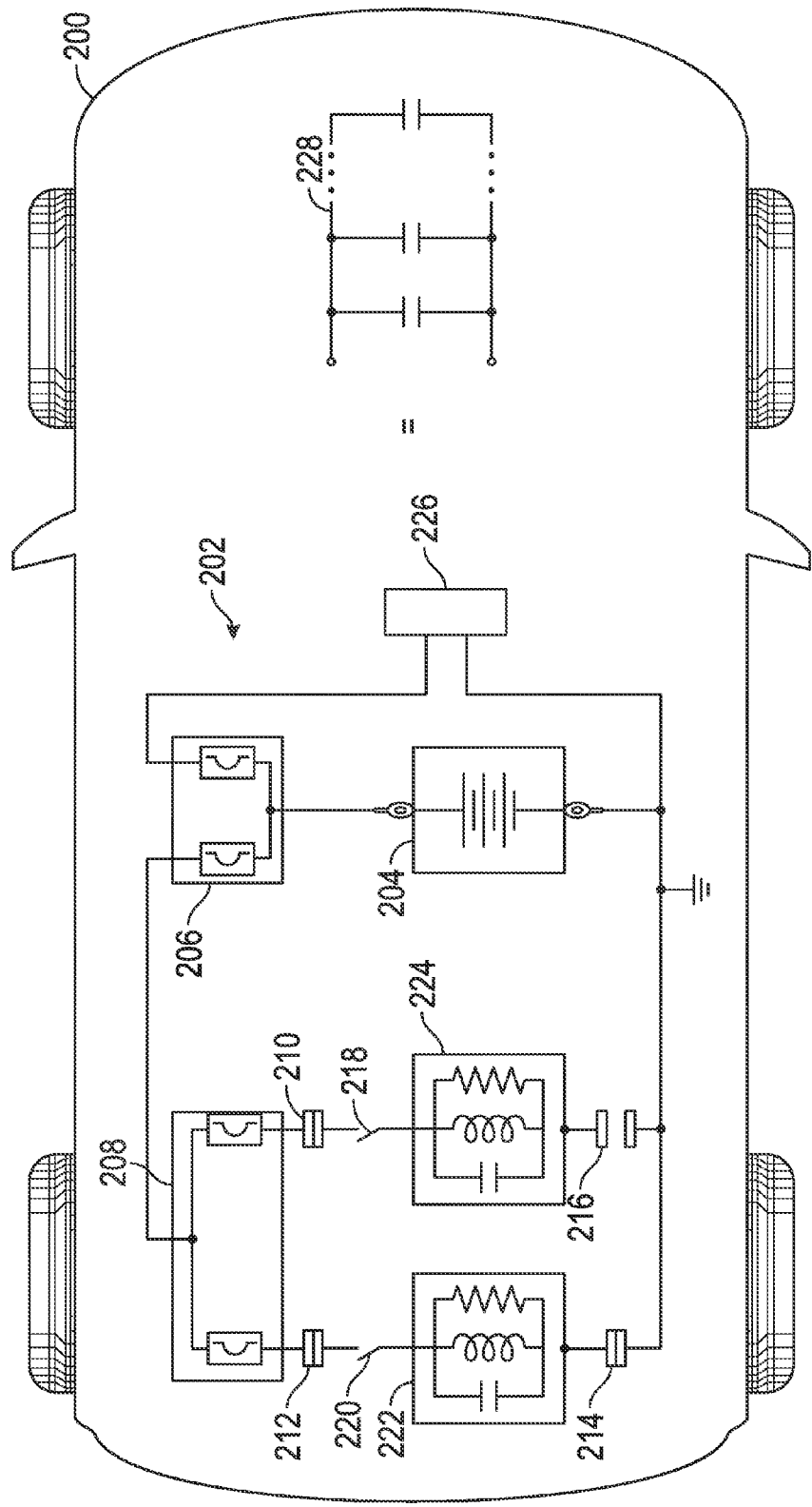
FIG. 2 is an embodiment of a vehicle subsystem in a vehicle, in accordance with an embodiment.

FIG. 2 illustrates an embodiment of a vehicle subsystem 202 (shown as reference 114 in FIG. 1) in a vehicle 200. As shown in FIG. 2, a vehicle subsystem 202 is connected to a vehicle battery 204, and may include, without limitation: fuse centers 206, 208; connectors 210, 212, 214, 216; switches 218, 220; loads 222, 224; and a data link connector (DLC) 226. The fuse centers 206, 208 are configured to protect the wiring of the vehicle subsystem 202, by breaking the circuit when a fault is present that causes more current to flow than the wiring is configured to handle. The switches 218, 220 present in the vehicle subsystem 202 are configured to connect applicable loads 222, 224 within the circuitry when needed for use. For example, if a load 222 represented the vehicle 200 headlights, switch 218 would be closed upon activation of the headlights. Switches 218, 220 may be open or closed at any given time, as configured by a driver of the vehicle 200 or a service technician performing maintenance or repair to the vehicle 200. A DLC 226 is generally implemented as a multi-pin diagnostic connection port which may, in some embodiments, be used in conjunction with other testing equipment to measure an output voltage for a vehicle subsystem 202.

Figure 3:
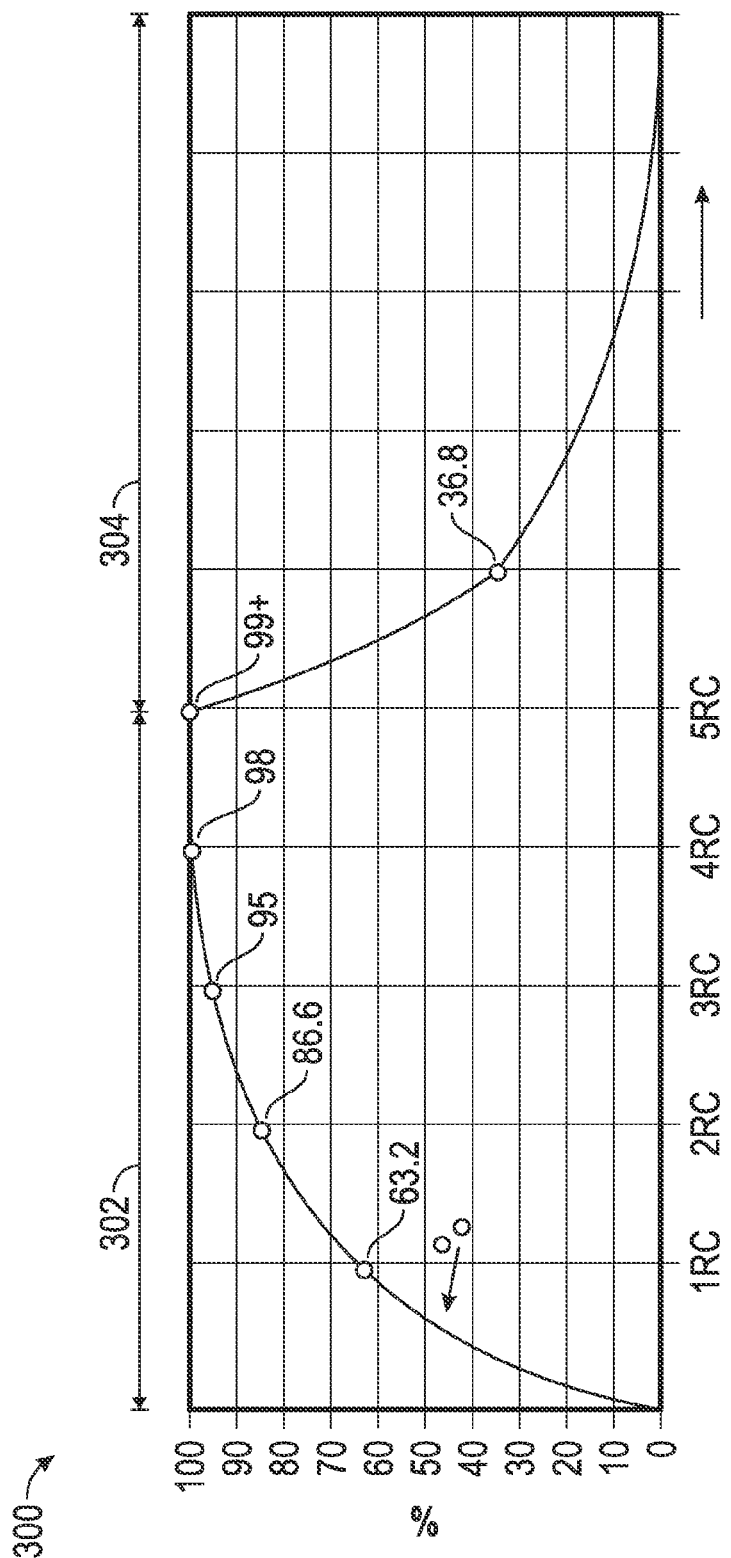
FIG. 3 is a plot of an output voltage waveform for a vehicle subsystem during charging and discharging, in accordance with an embodiment.

As shown in FIG. 2, each of the loads 222, 224 have reactive impedance with inherent inductance, resistance, and capacitance. When the vehicle 200 is started, the vehicle battery 204 provides voltage to the circuitry of the vehicle subsystem 202. The circuit components of the vehicle subsystem 202 are thus charged, exhibiting capacitor-like characteristics. FIG. 3 illustrates a plot 300 of an output voltage waveform for the vehicle subsystem during charging 302. As shown, the gradual increase of the output voltage waveform is comparable to the gradual increase in voltage of a capacitor during charging. Referring back to FIG. 2, the charge of the circuit components of the vehicle subsystem will decay with a predictable time constant ($\tau$) when the vehicle 200, and therefore the voltage supplied by the vehicle battery 204, is turned off. Each of the loads 222, 224 of vehicle subsystem 202 is connected in parallel, and analysis of the vehicle subsystem requires analysis of parallel capacitance values 228, as shown. FIG. 3 further illustrates a plot 300 of an output voltage waveform during discharging 304. Again, the gradual decrease of the output voltage waveform during discharging 304 is comparable to that gradual decrease in voltage of a capacitor during discharging.

Referring back to FIG. 2, further, the wiring connectors 210, 212, 214, 216 include metal terminals housed in plastic. A basic capacitor may be defined as two conductors separated by a dielectric material; the wiring connectors 210, 212, 214, 216 satisfy this criteria and exhibit behavioral characteristics of such.

In certain exemplary embodiments, the loads 222, 224 present in a vehicle subsystem 202 are arranged using parallel circuitry. However, in some embodiments, a series architecture may be used instead of, or in combination with, the parallel arrangement. Further, exemplary embodiments involve a vehicle subsystem 202 in an energized, or charging, state, but other embodiments may utilize a vehicle subsystem 202 during discharge. Four basic equations are used to analyze the vehicle subsystem 202, and to calculate a capacitance value:

(1) Charging $V(t)=V_O(1-e^{-t/\tau})$
(2) Discharging $V(t)=V_O(e^{-t/\tau})$
(3) The total capacitance of capacitors in parallel: $C_{total}=C_1+C_2+\ldots+C_n$.
(4) The total capacitance of capacitors in series:

$$\frac{1}{C_{total}} = \frac{1}{C_1} + \frac{1}{C_2} + \ldots + \frac{1}{C_n}$$

In accordance with some embodiments, the vehicle subsystem 114 may include, without limitation: a processor architecture 116; a system memory 118; a fault detection module 120; and a fault location module 122. These elements and features of a vehicle subsystem 114 may be operatively associated with one another, coupled to one another, or otherwise configured to cooperate with one another as needed to support the desired functionality—in particular, detecting and locating wiring faults within the vehicle subsystem 114, as described herein. For ease of illustration and clarity, the various physical, electrical, and logical couplings and interconnections for these elements and features are not depicted in FIG. 1. Moreover, it should be appreciated that embodiments of the vehicle subsystem 114 will include other elements, modules, and features that cooperate to support the desired functionality. For simplicity, FIG. 1 only depicts certain elements that relate to the relevant functionality, described in more detail below.

The processor architecture 116 may be implemented or performed with one or more general purpose processors, a content addressable memory, a digital signal processor, an application specific integrated circuit, a field programmable gate array, any suitable programmable logic device, discrete gate or transistor logic, discrete hardware components, or any combination designed to perform the functions described here. In particular, the processor architecture 116 may be realized as one or more microprocessors, controllers, microcontrollers, or state machines. Moreover, the processor architecture 116 may be implemented as a combination of computing devices, e.g., a combination of digital signal processors and microprocessors, a plurality of microprocessors, one or more microprocessors in conjunction with a digital signal processor core, or any other such configuration.

The system memory 118 may be realized using any number of devices, components, or modules, as appropriate to the embodiment. Moreover, the vehicle subsystem 114 could include system memory 118 integrated therein and/or system memory 118 operatively coupled thereto, as appropriate to the particular embodiment. In practice, the system memory 118 could be realized as RAM memory, flash memory, EPROM memory, EEPROM memory, registers, a hard disk, a removable disk, or any other form of storage medium known in the art. The system memory 118 can be coupled to the processor architecture 116 such that the processor architecture 116 can read information from, and write information to, the system memory 118. In the alternative, the system memory 118 may be integral to the processor architecture 116. As an example, the processor architecture 116 and the system memory 118 may reside in a suitably designed application-specific integrated circuit (ASIC).

The fault detection module 120 is suitably configured to detect wiring faults that exist in the vehicle subsystem 114 and interconnected wiring. Wires supplying voltage have an inherent mutual capacitance impedance to voltage. Wiring in the vehicle 100, and more specifically, wiring in the vehicle subsystem 114, has an inherent impedance value. When the wiring is intact, the impedance manifests itself as a capacitance value. When the wiring includes an open-wire fault, the impedance manifests itself as a capacitance value.

The fault detection module 120 utilizes a low-pass filter circuit to determine whether an open-wire fault exists in the vehicle subsystem 114. A large resistance value is incorporated into the wiring of the vehicle subsystem 114, creating a voltage divider circuit when the circuitry is intact; however, when an open-wire fault exists in the system, the circuitry is more appropriately referenced as a low-pass filter circuit. In certain embodiments, the large resistance value is implemented using an actual resistor, however, the large resistance value may be implemented using any suitable means for creating resistance in a wire. Generally, the inherent resistance value of the wire is on the order of milliohms, while the large resistance value that is added is on the order of megaohms. An acceptable increase in resistance from the inherent resistance value to the required resistance value in the low-pass filter circuit is about $10^9$ ohms. It is important to note that resistance values that are much higher than that of $10^9$ may introduce an impedance into the circuit that is disruptive to other equipment in the vehicle subsystem 114, such as analog-to-digital converters, while resistance values that are much lower than $10^9$ are not adequate to create the desired output voltage.

Figure 4:
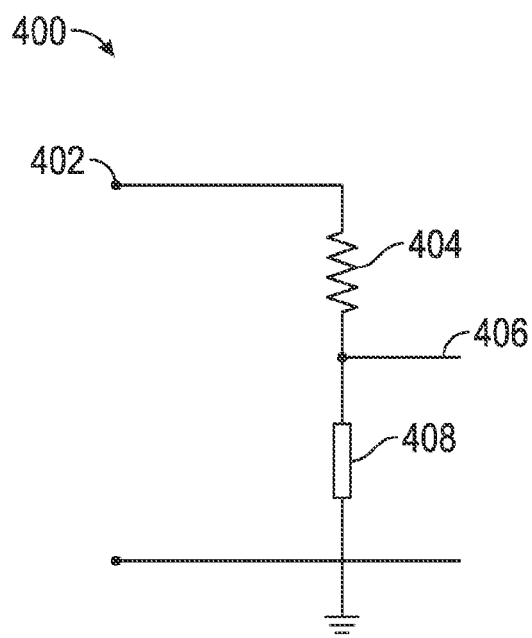
FIGS. 4-5 include circuit diagrams illustrating a wire with an open-wire fault and a wire without an open-wire fault, in accordance with an exemplary embodiment.
Figure 5:
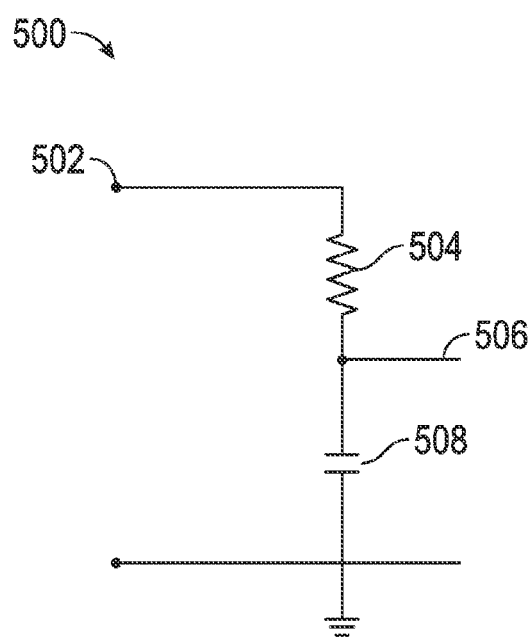

The large resistance value is incorporated into the vehicle subsystem 114, as shown in FIGS. 4-5. FIG. 4 illustrates a voltage divider circuit 400 with attached load 408, and FIG. 5 illustrates a low-pass filter circuit 500 with an open-wire fault 508 preventing recognition of a load, in accordance with an exemplary embodiment. As shown, the voltage divider circuit 400 with an attached load 408 incorporates an input voltage ($V_{IN}$) 402 and an output voltage ($V_O$) 406 is measured across a resistance 404. Normally, the wiring of the voltage divider circuit 400 has an inherent resistance. This inherent resistance, in combination with the additional large resistance that has been incorporated into the vehicle subsystem, creates a combined resistance 404. The output voltage ($V_O$) 406 of the voltage divider circuit 400 is calculated using the following equation:

$$V_O = \left(\frac{R_{LOAD}}{R_{COMBINED} + R_{LOAD}}\right) * V_{IN}.$$

Using this equation, the output voltage ($V_O$) 406, or in other words, the voltage across the combined resistance 404, is approximately zero (or a value that is very close to zero). The reason that the output voltage ($V_O$) 406 is approximately zero is due to the large value of the combined resistance 404; the value of the combined resistance 404 is selected with the intent to render a near-zero output voltage ($V_O$) 406 in the voltage divider circuit 400 when there is a load 408 having any resistance value.

Referring now to FIG. 5, when an open-wire fault exists in the wiring, the low-pass filter circuit 500 behaves as if a capacitor 508 were present. Since the wire is open, any potential load is disconnected from the rest of the low-pass filter circuit 500. The output voltage ($V_O$) 506 is measured across the combined resistance 504, which is the inherent resistance of the wire in combination with the large resistance value that was added to the low-pass filter circuit 500. When there is an open-wire fault and the low-pass filter circuit 500 behaves as if a capacitor 508 were present, the resultant output voltage ($V_O$) 506 no longer has a value of approximately zero. Instead, the value of the output voltage ($V_O$) 506 is approximately equivalent to the value of the input voltage ($V_{IN}$) 502. The output voltage ($V_O$) 506 of the low-pass filter circuit 500 is calculated using the following equation:

$$V_O = \left(\frac{1}{1 + R_{COMBINED} * C * S}\right) * V_{IN}.$$

Turning back to FIG. 1, the fault detection module 120, utilizes this model to detect an open-wire fault in the wiring of the vehicle subsystem 114. Essentially, the fault detection module 120 incorporates a large resistance which, in combination with the resistance inherent in the wiring, provides the first impedance value in a voltage divider circuit, when the circuitry is intact. When a load is present (i.e., when an open-wire fault does not exist), then the load provides the second impedance value in the voltage divider circuit, and the resultant output voltage value is approximately zero. When a load is not present (i.e., when an open-wire fault exists and eliminates a connection to the load), then the circuitry behaves as if a capacitor were present, due to the inherent capacitance of the wiring, and the output voltage value is approximately equal to the input voltage value.

The fault location module 122 is suitably configured to determine the location of an existing open-wire fault in the vehicle subsystem 114. Once the fault detection module 120 determines that an open-wire fault exists in the vehicle subsystem 114, the fault location module 122 determines a distance from the newly-incorporated, large resistance of the low-pass filter circuit, at which the open-wire fault resides.

The large resistance value performs the previously described function of regulating the voltage output of the low-pass filter circuit and, in addition, it has a second function: increasing the time required to charge or discharge the capacitance of the wire through the combined resistance of the circuit, in the case of an open-wire fault. Because the circuit behaves as if a capacitor is present (in the case of an open-wire fault), the low-pass filter circuit exhibits behavioral characteristics similar to a first-order resistor-capacitor (RC) circuit. Increasing the time required to charge or discharge the capacitance of the wire effectively increases the time-constant ($\tau$) of the RC circuit. As is well-known in the art, $\tau$ may be measured as the time it takes for an output voltage waveform of the RC circuit to reach approximately 63.2% of the final output voltage. The time-constant ($\tau$) is measured in seconds, and is equal to the product of the circuit resistance (in ohms) and the circuit capacitance (in farads).

Increasing $\tau$ translates to increasing the time it takes the capacitance of the wire to discharge, effectively slowing down the process. Under normal conditions (e.g., without incorporating a large resistance value to increase $\tau$), the system is required to sample the output voltage at an extremely fast rate to obtain an accurate output voltage waveform. This is due to the rise-time for the output voltage waveform being a very small value. In other words, the waveform rises so quickly that it is very difficult, if not impossible, to sample it in such a way as to get an accurate estimation of the output waveform. When $\tau$ is increased, the rise-time of the output waveform is also increased, and the sampling may be slowed down to a rate that is manageable. Additional advantages of increasing $\tau$ include the ability to sample the output voltage using less expensive equipment, which makes the solution feasible for implementation.

Figure 6:
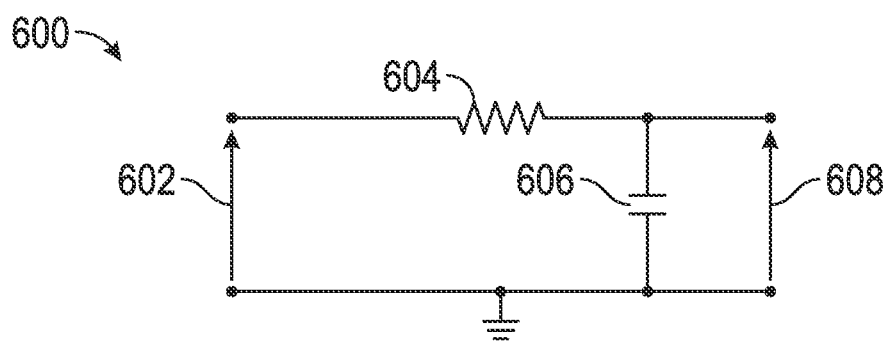
FIGS. 6-7 illustrate circuit diagrams utilized in fault detection and location determination, in accordance with an embodiment.
Figure 7:
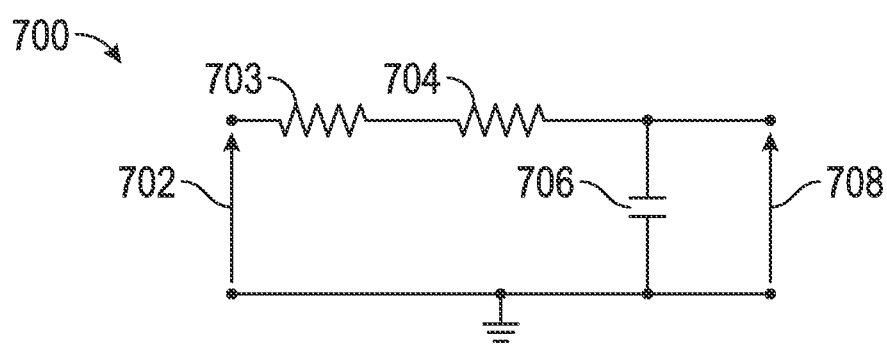

FIGS. 6-7 illustrate an example of a first order RC circuit before and after incorporating a large resistance value in order to increase the time-constant ($\tau$). FIG. 6 illustrates an RC circuit 600 with an open-wire fault 606 incorporates an input voltage ($V_{IN}$) 602 and an output voltage ($V_O$) 608 is measured across simulated capacitor 606 (e.g., an open-wire fault). Here, the wiring of the RC circuit 600 has an inherent resistance 604. The output voltage ($V_O$) 608 of the RC circuit 600 is calculated using the following equation:

$$V_O = \left(\frac{1}{1 + R_{WIRE} + C_{WIRE} * S}\right) * V_{IN}.$$

The time-constant ($\tau$) is calculated using the following equation: $\tau = R_{WIRE} * C_{WIRE}$. For example, if the inherent resistance ($R_{WIRE}$) 604 of the wire has a value of 200 milliohms (200×10$^{-3}$ ohms) and the capacitance ($C_{WIRE}$) 606 present due to an open-wire fault has a value of 500 picofarads (500×10$^{-12}$ farads), then $\tau$=0.1 nanoseconds.

In contrast, FIG. 7 illustrates a second RC circuit 700 with an open-wire fault 706. The RC circuit 700 incorporates an input voltage ($V_{IN}$) 702, and an output voltage ($V_O$) 708 is measured across a simulated capacitor (e.g., open-wire fault 706). Normally, the wiring of the RC circuit 700 has an inherent resistance 704. This inherent resistance 704, in combination with the additional large resistance 703 that has been incorporated into the vehicle subsystem, creates a combined resistance value. The output voltage ($V_O$) of the RC circuit 700 is calculated using the following equation:

$$V_O = \left(\frac{1}{1 + (R_{WIRE} + R_{ADDITION}) * C_{WIRE} * S}\right) * V_{IN}.$$

The time-constant ($\tau$) is calculated using the following equation: $\tau = (R_{WIRE} R_{ADDITION}) * C_{WIRE}$.

For example, if the inherent resistance ($R_{WIRE}$) 704 of the wire has a value of 200 milliohms (200×10$^{-3}$ ohms), the additional large resistance ($R_{ADDITION}$) 703 has a value of 20 megaohms (20×10$^6$ ohms), and the capacitance ($C_{WIRE}$) 706 present due to an open-wire fault has a value of 500 picofarads (500×10$^{-12}$ farads), then $\tau$=0.01 seconds. In this example, incorporating the additional large resistance ($R_{ADDITION}$) 703 into the RC circuit 700 slowed the time-constant ($\tau$) from 0.1 nanoseconds to 0.01 seconds.

Figure 8:
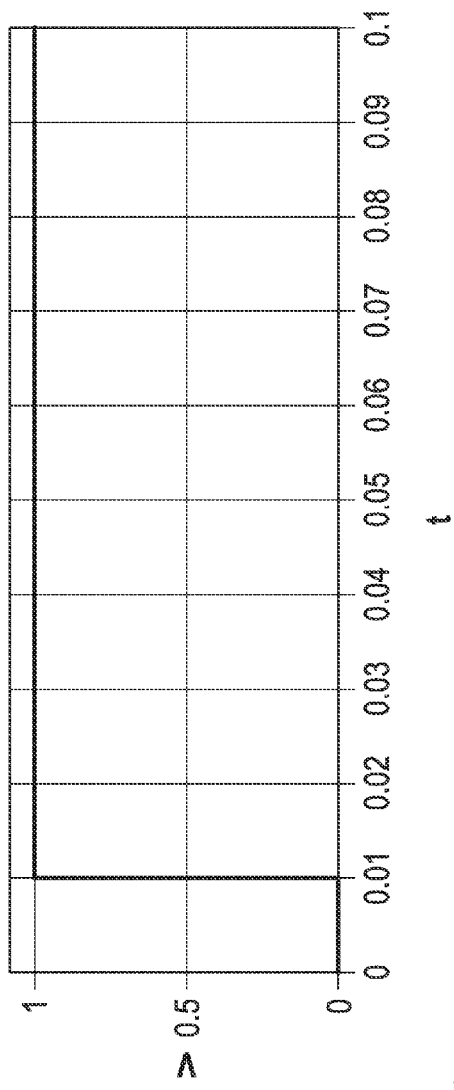
FIGS. 8-10 illustrate graphs of examples of input and output voltage for a fault detection and location circuit, in accordance with an embodiment.
Figure 9:
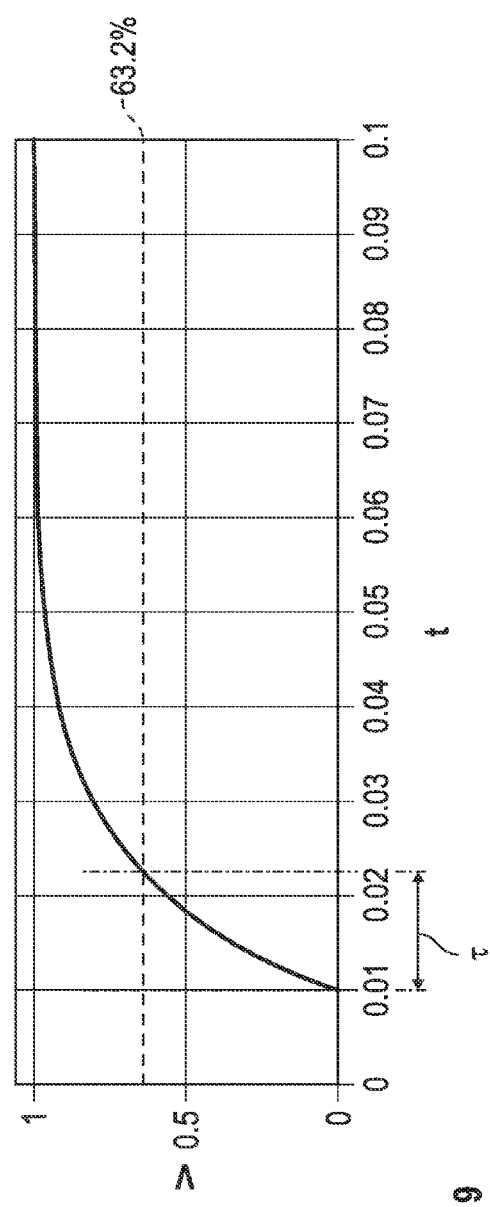
Figure 10:
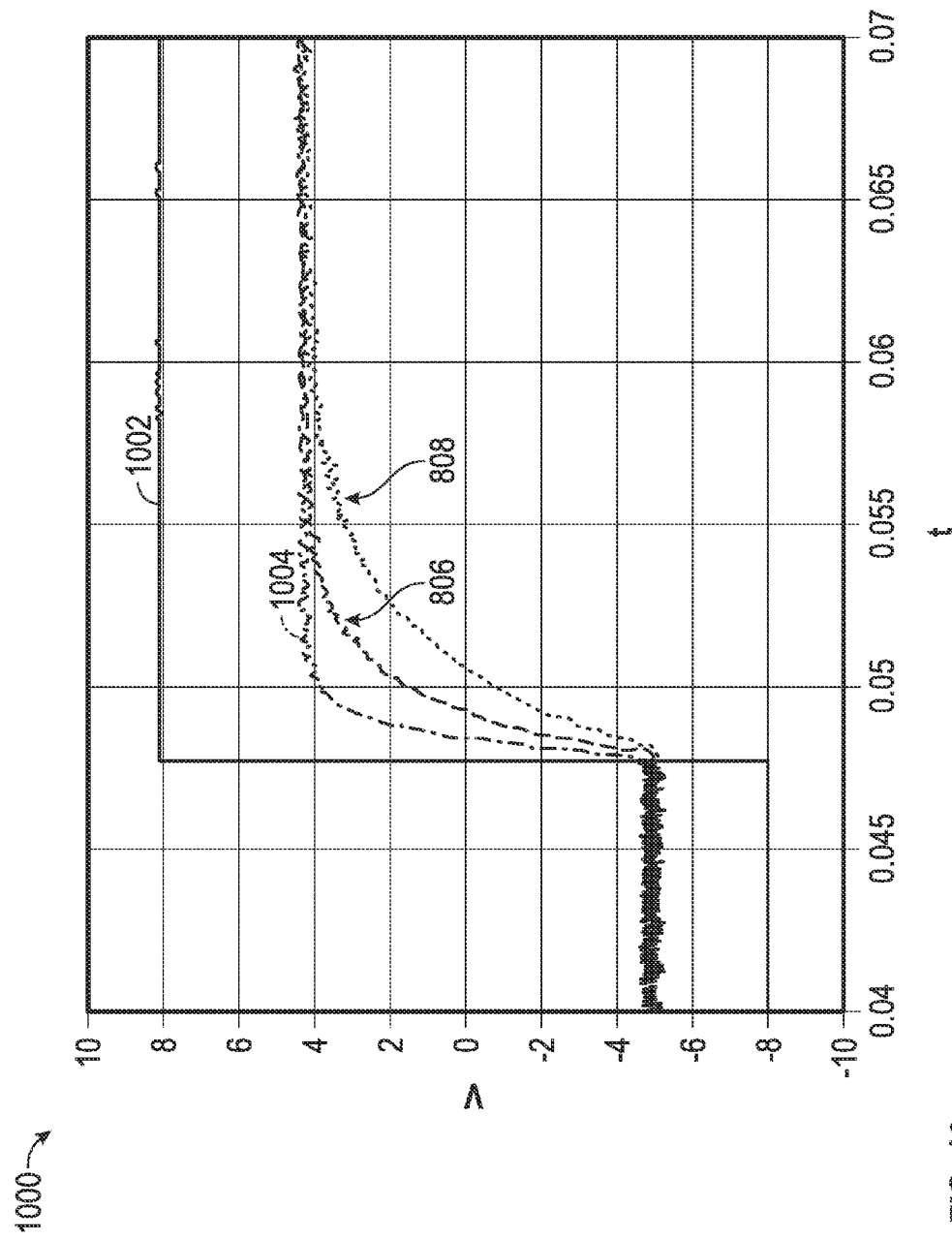

Once $\tau$ has been increased, thereby slowing the rise-time of the output voltage ($V_O$), the location of the open-wire fault is determined using the output voltage waveform. FIGS. 8-10 illustrate this principle. As shown in FIG. 8, an input step voltage is applied to the wiring of a vehicle subsystem having an open-wire fault, creating the associated output voltage waveform shown in FIG. 9. As shown, the output voltage waveform has a time-constant ($\tau$) of approximately 0.0134 seconds, or in other words, the output voltage waveform takes approximately 0.0134 seconds to reach 63.2% of its final value.

Further, FIG. 10 illustrates a combination graph 1000, showing input step voltage 1002 and output voltage waveforms (1004, 1006, 1008). Output voltage waveform 1004 has the steepest curve of the three output voltage waveforms (1004, 1006, 1008) depicted. This indicates that output voltage waveform 1004 has the shortest rise-time, or in other words, the shortest time period in which the output voltage rises from a value of zero to 63.2% of its final value. Output voltage waveform 1004 is a representation of the output voltage when an open-wire fault is located one-eighth (⅛) of the distance of the wire from the large resistance value that was added to the system (in this example, this location is also the location of the input step voltage).

Output voltage waveform 1006 has the next-shortest rise-time, and represents the output voltage when an open-wire fault is located one-half (½) of the distance of the wire from the large resistance value that was added. Output voltage waveform 1008 has the longest rise-time, and represents the output voltage when an open-wire fault is located at the end of the wire, or in other words, at the load of the particular wire for which an open-wire fault has been detected.

Plot 1000 illustrates the relationship between the input step voltage 1002 and output voltage waveforms (1004, 1006, 1008) that occur when the open-wire fault resides at various locations on the wire. As described with regard to FIGS. 1-7, the output voltage is measured over time, and the time-constant ($\tau$) is calculated based on the time required to charge or discharge the capacitance of the wire through the circuit resistance, which is roughly equivalent to the time required for the output voltage to reach 63.2% of its final value. This rise-time has been significantly slowed due to the added resistance to the circuit. Because τ=RC, the capacitance value is easily determined using the obtained ti-value and the combined resistance value of the circuit. Once the capacitance value has been obtained, the location of the open-wire fault may be determined.

Referring back to FIG. 1, the fault location module 122 is further configured to estimate the time-constant (τ) based on the output voltage waveform, and to determine a location of an open-wire fault based on τ. Because τ=RC, the capacitance value may be determined using the obtained τ-value and the combined resistance value of the circuit. An exemplary embodiment of a circuit having an open-wire fault is shown in FIG. 5, where the output voltage ($V_O$) 506 of the low-pass filter circuit (shown as low-pass filter circuit 500) is calculated using the following equation:

$$V_O = \left( \frac{1}{1 + R_{COMBINED} * C * S} \right) * V_{IN}.$$

Here, using the charging formula $V(t)=V_O(1-e^{-t/\tau})$, with a known, ideal value of total parallel capacitance and a measured output voltage ($V_O$) 506, along with the known values of the input voltage ($V_{IN}$) 502 and combined resistance 504, the actual capacitance value may be calculated. Here, the charging formula may be manipulated to create the following ratio:

$$\frac{(\ln(1 - V_C/V_O) = -t/RC)_{SV}}{(\ln(1 - V_C/V_O) = -t/RC)_m} = \frac{C_m}{C_{SV}}$$

In the ratio, the subscript SV indicates a "saved value", or the ideal values for the presented variables in the vehicle subsystem 114. Generally, the saved values are saved in a lookup table in system memory 118. The subscript m indicates a "measured value", or the current, actual values that have been determined for the vehicle subsystem 114. Once the actual capacitance value is calculated using the ratio, this value may be used to determine the location of the detected fault in the vehicle subsystem.

Figure 11:
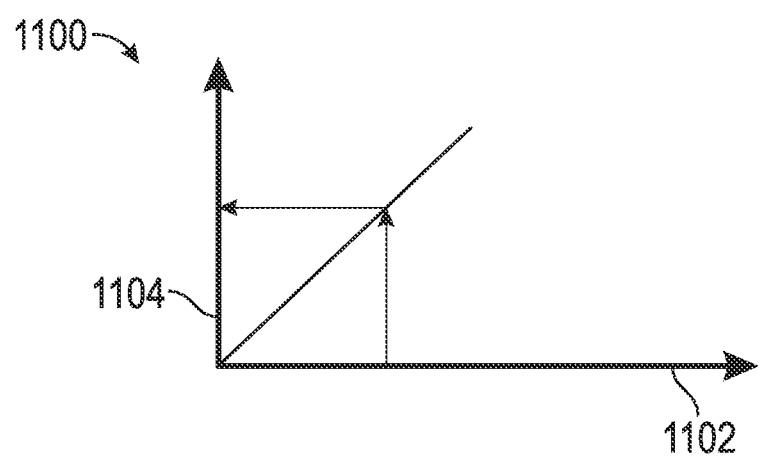
FIG. 11 is a plot of the linear relationship between capacitance values and length of wiring, in accordance with an embodiment.

Generally, the capacitance value is linearly proportional to the length of the wire, and may be simply calculated using the known values described previously. This concept is illustrated in FIG. 11, where plot 1100 shows capacitance values 1102 along the x-axis, lengths of wire (in meters) 1104 along the y-axis, and a linear relationship between these two. However, due to anomalies in existing wiring, such as the presence of connectors, the calculated capacitance value may not be accurate, so a lookup may be performed instead. Referring back to FIG. 1, the fault location module 122 utilizes a lookup table stored in system memory 118, which details a given capacitance value per length of wire in the vehicle subsystem 114. This given capacitance value is the ideal capacitance in the wiring of the vehicle subsystem under normal conditions (i.e., when no open-wire fault is present). The fault location module 122 performs the lookup using the calculated, actual capacitance value, and a distance from the additional large resistance is obtained from the lookup table, based on the actual capacitance value.

In certain embodiments, there are connectors in the vehicle subsystem 114, and the capacitance of the wire is not linearly proportional to the length of wire, so the lookup is no longer straightforward. In this case, it is necessary to interpolate between values that exist in the lookup table, to determine a location of the fault that exists between the two values. There are multiple ways of doing this, such as linear extrapolation between two applicable values to obtain a ratio between the two values, or such as creating a spline-curve between the points in the lookup table, and perform curve-fitting to estimate an applicable distance value. In embodiments including wiring connectors, any interpolation includes connector locations; open wiring connectors are the most likely cause of an open-wire fault. For example, if the fault location module 122 obtains a capacitance value of 220 picofarads ($220 \times 10^{-12}$ farads), which is associated to a distance X, but there is a wiring connector located at X+1, the distance will be estimated to be X+1, based on the likelihood of an open-wire fault at that location.

The distance obtained from the lookup table, or interpolated from the data available in the lookup table, is the distance from the additional large resistance that has been incorporated into the low-pass filter circuit, to the location of the open-wire fault. In some embodiments, this distance is also the distance from the application of the input voltage signal of the low-pass filter circuit. The location of the fault may then be measured from this point, using the distance obtained from the lookup table.

In certain embodiments, the fault detection module 120 and the fault location module 122 may be implemented as an internal part of a vehicle subsystem 114, as described above. In other embodiments, the fault detection module 120 and the fault location module 122 are implemented as an external testing tool, which may be connected to the vehicle subsystem 114 when necessary to conduct a diagnostic test. An external testing tool may be used during manufacture of the vehicle 100 to ensure quality in the build, and/or during vehicle servicing or repair.

Figure 12:
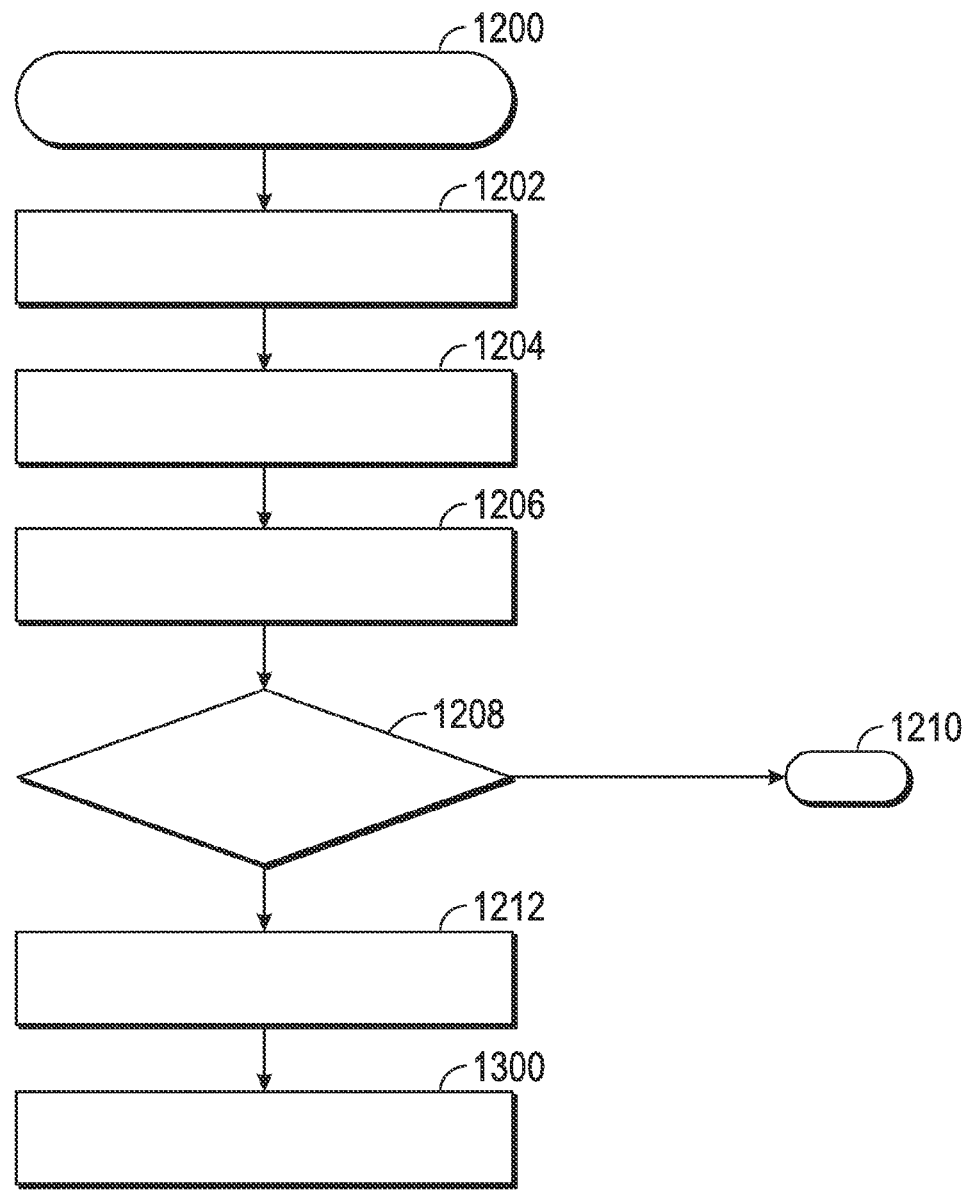
FIG. 12 is a flow chart that illustrates an embodiment of a process for fault detection.

FIG. 12 is a flow chart that illustrates an embodiment of a process 1200 for open-wire fault detection in a vehicle subsystem. The various tasks performed in connection with process 1200 may be performed by software, hardware, firmware, or any combination thereof. For illustrative purposes, the following description of process 1200 may refer to elements mentioned above in connection with FIGS. 1-11. In practice, portions of process 1200 may be performed by different elements of the described system. It should be appreciated that process 1200 may include any number of additional or alternative tasks, the tasks shown in FIG. 12 need not be performed in the illustrated order, and process 1200 may be incorporated into a more comprehensive procedure or process having additional functionality not described in detail herein. Moreover, one or more of the tasks shown in FIG. 12 could be omitted from an embodiment of the process 1200 as long as the intended overall functionality remains intact.

For ease of description and clarity, this example assumes that the process 1200 begins when a large resistance is incorporated into the circuitry of a vehicle subsystem (step 1202). Generally, the circuitry of the vehicle subsystem operates as a low-pass filter. When intact (i.e., when an open-wire fault does not exist in the vehicle subsystem), the additional large resistance creates a voltage divider circuit, and is used in combination with an inherent resistance value in the wiring as the first impedance value of the voltage divider circuit. The second impedance value in the voltage divider circuit, if intact, is the attached load in the vehicle subsystem. However, when the circuit is not intact due to the existence of an open-wire fault, the circuit may be more appropriately referenced as a low-pass filter circuit. The additional large resistance may be introduced into the system via a testing apparatus, which may include: the additional large resistance and circuitry to determine the existence and location of an open-wire fault, according to the disclosed embodiments (described in detail infra).

After the large resistance value is incorporated into the circuitry (step 1202), an input voltage is applied to the vehicle subsystem (step 1204). Application of an input voltage activates the circuitry, and electrical signals are conducted via the wiring of the subsystem. Generally, the input voltage is received from the vehicle battery, and the circuitry is activated at startup of the vehicle.

Next, the process 1200 initiates measurement of the output voltage of the low-pass filter circuit (step 1206). The output voltage may be measured using an oscilloscope, multimeter, or other voltage measurement device. In other embodiments, specialized circuitry may be used to measure the output voltage.

After measuring the output voltage of the low-pass filter circuit (step 1206), the process 1200 determines whether the output voltage is less than a predefined threshold voltage (step 1208). If the output voltage of the low-pass filter circuit is less than the predefined threshold voltage (the "Yes" branch of 1208), then the process ends (step 1210). In this case, the output voltage indicates that an open-wire fault does not exist in the vehicle subsystem. However, if the output voltage of the low-pass filter circuit is not less than the predefined threshold (the "No" branch of 1208), then an open-wire fault has been detected (step 1212), and the process 1200 moves on to determine the location of the open-wire fault (step 1300).

Figure 13:
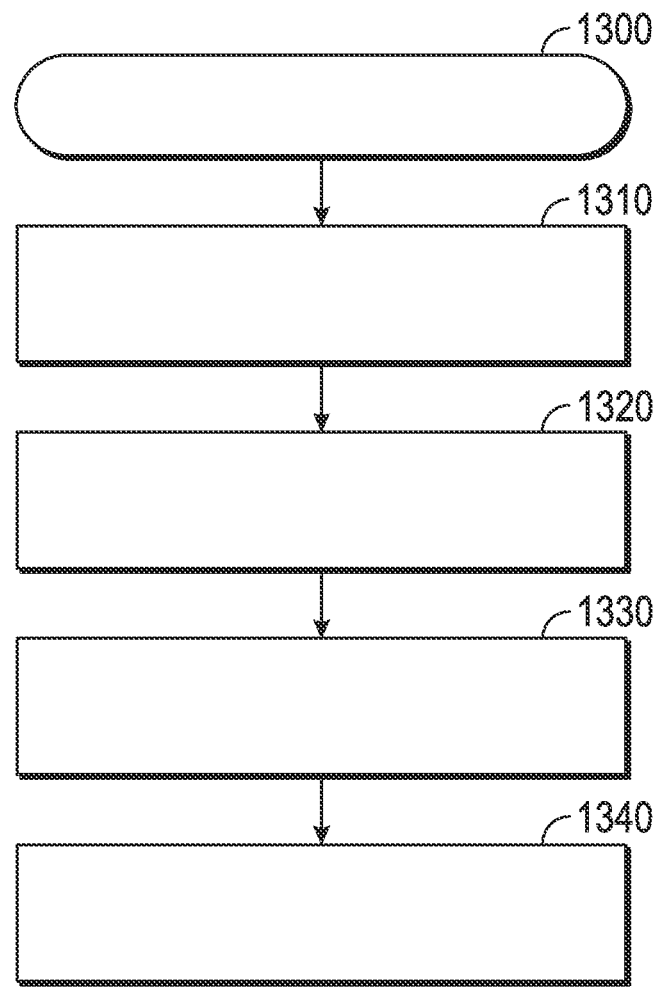
FIG. 13 is a flow chart that illustrates an embodiment of a process for determining a location of an open-wire fault.

FIG. 13 is a flow chart that illustrates an embodiment of a process for determining a location of an open-wire fault. This example assumes that the process 1300 begins by initiating application of an input step voltage at the low-pass filter circuit referenced in FIG. 12 (step 1310). Following application of the input step voltage, the process 1300 initiates measurement of an output voltage of the low-pass filter circuit (step 1320) and determines a capacitance value of the low-pass filter circuit (step 1330) based on the output voltage.

Once the capacitance value has been determined based on the output voltage of the low-pass filter circuit (step 1330), the process 1300 determines a distance from the input voltage source to the open-wire fault, based on the determined capacitance value (step 1340). This distance indicates the location of the open-wire fault in the wiring of the vehicle subsystem, relative to the additional large resistance value that was incorporated.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "processor-readable medium" or "machine-readable medium" may include any medium that can store or transfer information.

Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for detecting and locating an open-wire fault within a vehicle subsystem, the method comprising:
    incorporating a large resistance into the vehicle subsystem to create a low-pass filter circuit in the vehicle subsystem, the vehicle subsystem comprising an electronic control unit (ECU), interconnected wiring, and at least one wiring connector;
    comparing an output voltage of the low-pass filter circuit of the vehicle subsystem to a threshold voltage;
    detecting that an open-wire fault exists in the vehicle subsystem when the output voltage is not less than the threshold voltage;
    determining a capacitance value of the low-pass filter circuit;
    performing a lookup, using the capacitance value, to determine a location of the detected open wire fault;
    comparing the location of the open-wire fault to a connector location of the at least one wiring connector in the vehicle subsystem; and
    when the comparing results in a match between the location and the connector location, designating the at least one wiring connector as requiring repair.

2. The method of claim 1, further comprising:
    when the output voltage is less than the threshold voltage, determining that an open-wire fault does not exist, and setting an indicator signifying healthy wiring and connections of the vehicle subsystem.

3. The method of claim 1, wherein the determining step further comprises:

obtaining a capacitor voltage step response of the low-pass filter circuit;

calculating a time-constant from the capacitor voltage step response; and determining the capacitance value based on the calculated time-constant.

4. The method of claim 3, further comprising:

comparing the capacitor voltage step response to a predefined step response to calculate the time-constant;

wherein the predefined step response occurs when the open-wire fault occurs at a load of the vehicle subsystem.

5. The method of claim 1, further comprising:

comparing the location of the open-wire fault to a plurality of connector locations in the vehicle subsystem, the plurality of connector locations comprising the connector location; and when a match is not found, designating wiring of the vehicle subsystem, at the location, as requiring repair.

6. The method of claim 1, wherein determining the location of the open-wire fault further comprises:

obtaining a value for a total length of wire in the vehicle subsystem; and calculating a distance from an input voltage to the open-wire fault, using the value for the length of wire in the vehicle subsystem and a value of capacitance per a specified length of wire.

7. The method of claim 1, wherein the performing step further comprises:

when the determined capacitance value falls between two capacitance values in a lookup table, interpolating between the two capacitance values to determine a distance from an input voltage;

wherein the location of the open-wire fault comprises a position at the determined distance from the input voltage.

8. A method for detecting and locating an open-wire fault within a vehicle subsystem, the method comprising:

incorporating a large resistance into the vehicle subsystem to create a low-pass filter circuit in the vehicle subsystem, the vehicle subsystem comprising an electronic control unit (ECU), interconnected wiring, and at least one wiring connector;

comparing an output voltage from the low-pass filter circuit, within the vehicle subsystem, to a threshold; and detecting that an open-wire fault exists in the vehicle subsystem when the output voltage is not less than the threshold;

determining a time-constant based on the output voltage;

determining a distance from an input voltage source, for the open-wire fault, based on the estimated time-constant;

comparing the distance from the input voltage source to a second distance for the at least one wiring connector of the vehicle subsystem; and when the comparing results in a match between the distance and the second distance, designating the at least one wiring connector as requiring repair.

9. The method of claim 8, further comprising:

when the output voltage is less than the threshold, determining that an open-wire fault does not exist in the vehicle subsystem and designating wiring in the vehicle subsystem as not currently requiring repair.

10. The method of claim 8, further comprising:

obtaining a capacitor voltage step response of the low-pass filter circuit; and estimating the time-constant based on the capacitor voltage step response.

11. The method of claim 10, further comprising:

comparing the capacitor voltage step response to a designated step response to estimate the time-constant;

wherein the designated step response occurs when the open-wire fault occurs at a load of the vehicle subsystem.

12. The method of claim 8, further comprising:

obtaining a length for a bundle of wires in the vehicle subsystem;

calculating the distance from the input voltage source to the open-wire fault, using the length for the bundle of wires in the vehicle subsystem and a value of capacitance per length of wire.

13. The method of claim 8, further comprising:

utilizing a lookup table to determine the distance from the input voltage source, for the open-wire fault, based on the estimated time-constant;

wherein the lookup table comprises a plurality of time-constant values and associated distance values.

14. The method of claim 13, further comprising:

interpolating between time-constant values in the lookup table to determine the distance from the input voltage source, when the estimated time-constant value is between two of the plurality of time-constant values in the lookup table.

15. A diagnostic system for detecting and locating an open-wire fault within a vehicle subsystem, the diagnostic system comprising:

a low-pass filter circuit, comprising at least a giga-ohm (GΩ) resistor and a plurality of wires, the plurality of wires configured to conduct electrical signals for the vehicle subsystem, the vehicle subsystem comprising the low-pass filter circuit, an electronic control unit (ECU), and at least one wiring connector;

a vehicle chassis, coupled to the low-pass filter circuit and configured to serve as a ground potential for the vehicle subsystem;

a system memory comprising at least one lookup table, the at least one lookup table comprising a plurality of capacitance levels corresponding to a plurality of respective distances;

a processor architecture, operatively associated with the system memory, wherein the processor architecture is configured to:

compare an output voltage, from the low-pass filter circuit, to a threshold; and detect that an open-wire fault exists in the vehicle subsystem when the output voltage is not less than a threshold;

determine a capacitance value of the low-pass filter circuit;

perform a lookup, using the capacitance value, to determine the distance to the open-wire fault from the input voltage source;

compare the location of the open-wire fault to a connector location of the at least one wiring connector in the vehicle subsystem; and when the comparing results in a match between the location and the connector location, designate the at least one wiring connector as requiring repair.

16. The diagnostic system of claim 15, wherein the processor architecture is configured to determine the capacitance value of the low-pass filter circuit by:

obtaining a capacitor voltage step response of the low-pass filter circuit;

calculating a time-constant from the capacitor voltage step response; and determining the capacitance value based on the calculated time-constant.

17. The diagnostic system of claim 16, wherein the processor architecture is further configured to:

compare the capacitor voltage step response to a predefined step response to calculate the time-constant;

wherein the predefined step response occurs when the open-wire fault occurs at a load of the vehicle subsystem.

18. The diagnostic system of claim 15, wherein the processor architecture is further configured to:

compare the determined location of the open-wire fault to a plurality of connector locations in the vehicle subsystem; and when the comparing results in a match between the determined location and one of the plurality of connector locations, designate the one of the plurality of connector locations as requiring repair.

19. The diagnostic system of claim 15, wherein the processor architecture is further configured to:

compare the determined location of the open-wire fault to a plurality of connector locations in the vehicle subsystem; and when a match is not found, designate wiring of the vehicle subsystem, at the determined location, as requiring repair.

* * * * *